United States Patent
Moon et al.

(10) Patent No.: US 11,489,035 B2
(45) Date of Patent: Nov. 1, 2022

(54) DISPLAY DEVICE

(71) Applicant: SAMSUNG DISPLAY CO., LTD., Yongin-si (KR)

(72) Inventors: Sang-Ho Moon, Cheonan-si (KR); Chun Gi You, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 202 days.

(21) Appl. No.: 17/066,721

(22) Filed: Oct. 9, 2020

(65) Prior Publication Data
US 2021/0126083 A1 Apr. 29, 2021

(30) Foreign Application Priority Data

Oct. 24, 2019 (KR) .......................... 10-2019-0132889

(51) Int. Cl.
*H01L 27/32* (2006.01)
*H01L 51/52* (2006.01)
*H05K 1/18* (2006.01)

(52) U.S. Cl.
CPC ...... *H01L 27/3276* (2013.01); *H01L 51/5253* (2013.01); *H05K 1/189* (2013.01); *H05K 2201/10128* (2013.01)

(58) Field of Classification Search
CPC ............. H01L 27/3276; H01L 27/3279; H01L 51/5253; H01L 51/5203; H05K 1/189; H05K 1/147; H05K 1/116; H05K 1/181; H05K 1/113; H05K 2201/10128; H05K 2201/05; H05K 2201/09409; H05K 2201/094; H05K 2201/09709; H05K 3/323; H05K 3/3436; H05K 5/0017; G02F 1/13458; G09F 9/301
See application file for complete search history.

(56) References Cited

U.S. PATENT DOCUMENTS

| | | | |
|---|---|---|---|
| 2006/0007086 A1* | 1/2006 | Rhee | G09G 3/3611 345/87 |
| 2014/0127916 A1* | 5/2014 | Lee | H05K 1/0248 439/74 |
| 2016/0242295 A1* | 8/2016 | Kim | H05K 1/111 |

FOREIGN PATENT DOCUMENTS

| | | |
|---|---|---|
| JP | 2019-087766 A | 6/2019 |
| KR | 10-2006-0124411 A | 12/2006 |
| KR | 10-1307260 B1 | 9/2013 |
| KR | 10-2014-0063305 A | 5/2014 |
| KR | 10-2019-0046420 A | 5/2019 |

* cited by examiner

*Primary Examiner* — Oluseye Iwarere
*Assistant Examiner* — Jose M Diaz
(74) *Attorney, Agent, or Firm* — Lewis Roca Rothgerber Christie LLP

(57) ABSTRACT

A display device includes: a substrate; an insulating layer on the substrate and including a first opening; a first panel pad on the substrate and the insulating layer; and an anisotropic conductive film on the first panel pad, and the first panel pad includes a center area located at a center of the first opening, and a first edge area and a second edge area arranged along a lateral side of the insulating layer and located on respective sides of the center area with respect to a first direction, and the anisotropic conductive film overlaps at least one of the center area, the first edge area, and the second edge area of the first panel pad.

20 Claims, 14 Drawing Sheets

DISPLAY DEVICE

CROSS-REFERENCE TO RELATED APPLICATION

This application claims priority to and the benefit of Korean Patent Application No. 10-2019-0132889, filed on Oct. 24, 2019 in the Korean Intellectual Property Office, the entire content of which is incorporated herein by reference.

BACKGROUND

1. Field

Aspects of embodiments of the present disclosure relate to a display device.

2. Description of the Related Art

Display devices, such as an organic light emitting device or a liquid crystal display, are in use. The display device includes a display panel including pixels for displaying images. In addition to the pixels, the display panel includes a pad portion on which a driving device and a plurality of panel pads for inputting and outputting signals used for controlling the pixels and the driving device are disposed, and a flexible printed circuit board (FPCB) is bonded as an integrated circuit (IC) chip or a film to the pad portion. In this instance, an anisotropic conductive film (ACF) including conductive balls is used for the purpose of electrical connection and physical combination of the pad portion.

Recently, demands for a display device with a small dead space disposed near the region for displaying images of the display panel are increasing. When the dead space becomes large, a region for displaying the image may seem relatively small. As the dead space becomes small, the panel pads also gradually become small, and, accordingly, electrical connection of the pad portion with improved reliability is required.

The above information disclosed in this Background section is only for enhancement of understanding of the background of the described technology and, therefore, it may contain information that does not form the prior art that is already known in this country to a person of ordinary skill in the art.

SUMMARY

According to an aspect of the present disclosure, a display device having reduced resistance by increasing a contact area of a panel pad and preventing or substantially preventing an anisotropic conductive film (ACF) from peeling is provided.

According to another aspect of the present disclosure, a display device having improved electrical connection reliability of a panel pad by preventing or substantially preventing conductive balls of an anisotropic conductive film (ACF) from flowing to an external side of a panel pad and adjacent panel pads from being electrically connected to each other is provided.

According to one or more embodiments, a display device includes: a substrate; an insulating layer on the substrate and including a first opening; a first panel pad on the substrate and the insulating layer; and an anisotropic conductive film (ACF) on the first panel pad, wherein the first panel pad includes a center area located at a center of the first opening, and a first edge area and a second edge area arranged along a lateral side of the insulating layer and located at respective sides of the center area with respect to a first direction, and the anisotropic conductive film (ACF) overlaps at least one of the center area, the first edge area, and the second edge area of the first panel pad.

The display device may further include: a second panel pad arranged near the first panel pad in the first direction; and an organic layer on the insulating layer, wherein the organic layer may include a first organic layer and a second organic layer that are spaced from each other with the first panel pad and the second panel pad therebetween.

The display device may further include a first lower pattern between the substrate and the center area of the first panel pad.

The display device may further include a second lower pattern between the substrate and the center area of the first panel pad, and spaced from the first lower pattern in a second direction traversing the first direction.

The center area of the first panel pad may include a plurality of protruding portions, and the protruding portions may overlap the first lower pattern and the second lower pattern.

The first lower pattern may extend along the center area of the first panel pad.

The center area of the first panel pad may include a protruding portion, and the protruding portion may overlap the first lower pattern.

The display device may further include a second lower pattern between the substrate and the center area of the first panel pad, and spaced from the first lower pattern in the first direction.

The center area of the first panel pad may include a plurality of protruding portions, and the protruding portions may overlap the first lower pattern and the second lower pattern.

The display device may further include: a second panel pad arranged near the first panel pad in the first direction; and an organic layer on the insulating layer, wherein the organic layer may be between the first panel pad and the second panel pad, and the organic layer may not be located on the first edge area and the second edge area of the first panel pad.

The display device may further include: a data line to apply a data voltage; and a first extension wire extending from the first panel pad and electrically connected to the data line, wherein the first extension wire may overlap the first organic layer.

The display device may further include: a second extension wire extending from the first panel pad; and a test wire, wherein the insulating layer may include a second opening exposing the test wire, the second extension wire may be connected to the test wire in the second opening, and the second extension wire may overlap the second organic layer.

The display device may further include a flexible printed circuit board including a connecting pad, wherein the connecting pad may be electrically connected to the first panel pad through the anisotropic conductive film (ACF).

According to one or more embodiments, a display device includes: a display panel including a first panel pad and an organic layer for exposing the first panel pad; a flexible printed circuit board including a connecting pad; and an anisotropic conductive film (ACF) between the display panel and the flexible printed circuit board, wherein the first panel pad may include a concave center area and an edge area around the center area, and the organic layer may include a first organic layer and a second organic layer spaced from each other with the first panel pad therebetween.

The display panel may further include a substrate and an insulating layer between the substrate and the first panel pad, and the insulating layer may include a first opening in a region corresponding to the center area of the first panel pad.

The display panel may further include a first lower pattern between the substrate and the center area of the first panel pad.

The display panel may further include: a second panel pad located near the first panel pad in a first direction; and a second lower pattern between the substrate and the center area of the first panel pad, and spaced from the first lower pattern in a second direction traversing the first direction.

A width of the first lower pattern may be equal to or greater than 2 μm.

The first lower pattern may extend along the center area of the first panel pad.

The display panel may further include: a second panel pad located near the first panel pad in a first direction; and a second lower pattern between the substrate and the center area of the first panel pad, and spaced from the first lower pattern in the first direction.

According to an aspect of embodiments, the contact area of the panel pad is increased to reduce resistance, and the anisotropic conductive film (ACF) may be prevented or substantially prevented from peeling off the display panel.

Further, the conductive balls of the anisotropic conductive film (ACF) may be prevented or substantially prevented from flowing to the outside of the panel pad, the panel pads may be prevented or substantially prevented from being electrically connected to each other, and the electrical connection reliability of the panel pad may be improved.

DETAILED DESCRIPTION

Figure 1:
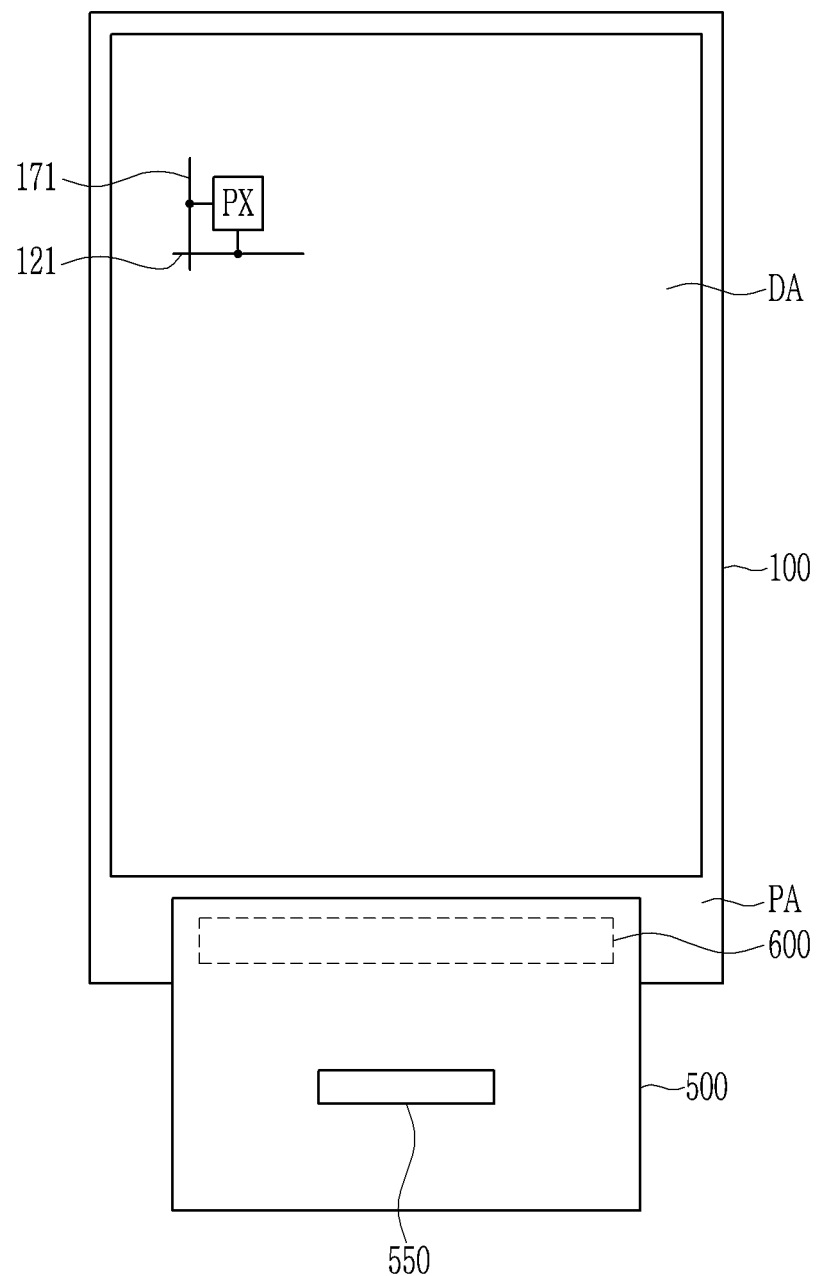
FIG. 1 shows a top plan view of a display device according to an example embodiment.

The present invention will be described more fully herein with reference to the accompanying drawings, in which some example embodiments of the invention are shown. As those skilled in the art would realize, the described embodiments may be modified in various different ways, all without departing from the spirit or scope of the present invention.

The drawings and description are to be regarded as illustrative in nature and not restrictive, and like reference numerals designate like elements throughout the specification.

The size and thickness of each configuration shown in the drawings may be arbitrarily shown for better understanding and ease of description, but the present invention is not limited thereto. In the drawings, the thickness of layers, films, panels, regions, etc. may be exaggerated for clarity. For better understanding and ease of description, the thicknesses of some layers and areas may be exaggerated.

Further, it is to be understood that when an element, such as a layer, film, region, or substrate, is referred to as being "on" another element, it may be directly on the other element or one or more intervening elements may also be present. In contrast, when an element is referred to as being "directly on" another element, there are no intervening elements present. Further, in the specification, "on" or "above" means positioned on or below the object portion, and does not necessarily mean positioned on the upper side of the object portion based on a gravitational direction.

Unless explicitly described to the contrary, the "comprise" and variations, such as "comprises" or "comprising," are to be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

It is to be understood that the terms "first" and "second" are used herein to describe various components but these components should not be limited by these terms. The above terms are used to distinguish one component from another. For example, a first component may be referred to as a second component and vice versa without departing from the scope of the inventive concept. Singular expressions include plural expressions unless the context clearly dictates otherwise.

In addition, terms such as "below," "the lower side," "on," and "the upper side" are used to describe a relationship of configurations shown in the drawing. The terms are described as a relative concept based on a direction shown in the drawing. It is to be understood that the spatially relative terms are intended to encompass different orientations of the device in use or operation in addition to the orientation depicted in the figures.

Unless otherwise defined, all terms (including technical and scientific terms) used herein have the same meaning as terms commonly understood by those skilled in the art to which this invention belongs. Also, terms such as terms defined in commonly used dictionaries should be interpreted as having meaning consistent with meaning in the context of the related art, and are not to be interpreted in an ideal or overly formal sense, unless they are explicitly so defined here.

A display device 10 according to an example embodiment will now be described with reference to FIG. 1 and FIG. 2. FIG. 1 shows a top plan view of a display device according to an example embodiment; and FIG. 2 shows an exploded perspective view of a display device according to an example embodiment shown with reference to FIG. 1.

Figure 2:
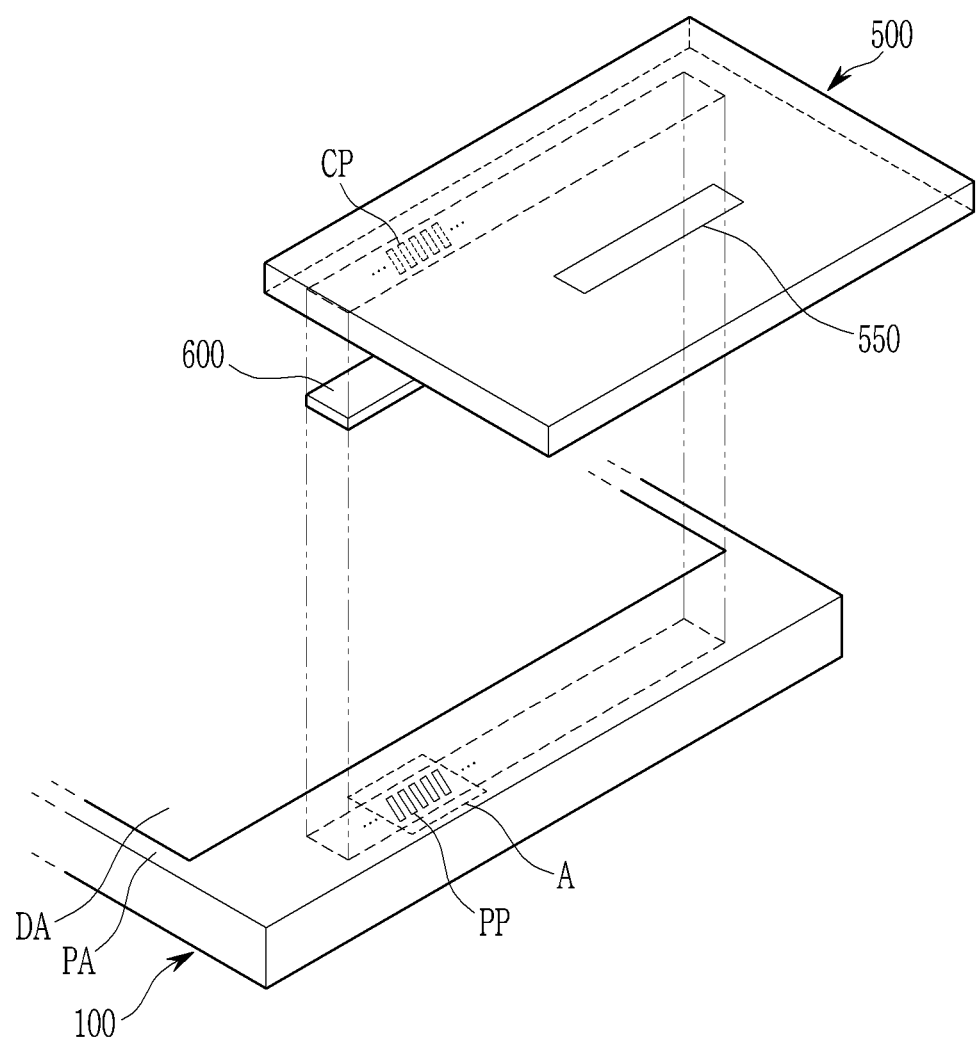
FIG. 2 shows an exploded perspective view of a display device according to an example embodiment.

Referring to FIG. 1 and FIG. 2, the display device 10 according to an example embodiment includes a display panel 100, a flexible printed circuit board 500, and an anisotropic conductive film (ACF) 600 for connecting the display panel 100 and the flexible printed circuit board 500.

In an embodiment, the display panel 100 may be an organic light emitting panel including an organic light emitting diode, or a liquid crystal panel including a liquid crystal layer.

The display panel 100 includes a display area DA for displaying images, and a peripheral area PA in which elements and wires for generating or transmitting various signals applied to the display area DA are disposed. The peripheral area PA may be disposed at an outside of the display area DA. The peripheral area PA is shown to surround the display area DA in FIG. 1; however, without being limited to this, it may be disposed on one side of the display panel 100. The display area DA is shown to have a quadrangular shape in FIG. 1; however, the display area DA may have any of various shapes, such as a circle, an oval, or a polygon, in addition to the quadrangle.

A plurality of signal lines and pixels PX connected to a plurality of signal lines are disposed in the display area DA of the display panel 100. The signal lines include a gate line 121 and a data line 171. In an embodiment, the gate lines 121 may substantially extend in a row direction (or a horizontal direction), and the data lines 171 may substantially extend in a column direction (or a vertical direction). The pixel PX represents a minimum unit for displaying an image, and the display device 10 may display an image through the pixel PX. The pixel PX may be connected to the gate line 121 and the data line 171, and may receive a gate signal and a data signal from the signal lines.

Depending on example embodiments, a plurality of signal lines disposed in the display area DA of the display panel 100 may further include a driving voltage line (not shown) for transmitting a driving voltage (ELVDD) and a common voltage line (not shown) for transmitting a common voltage (ELVSS). In an embodiment, a plurality of signal lines may further include a previous gate line (not shown) for transmitting a previous scan signal, an emission control line (not shown) for transmitting an emission control signal, a bypass control line (not shown) for transmitting a bypass signal, and an initialization voltage line (not shown) for transmitting an initialization voltage.

When the display panel 100 is an organic light emitting panel, the pixel PX may include a plurality of transistors (not shown), storage capacitors (not shown), and organic light emitting diodes (not shown). For example, a plurality of transistors may include a driving transistor, a switching transistor, and a compensation transistor.

The driving transistor, the switching transistor, and the compensation transistor may include a gate electrode, a source electrode, and a drain electrode.

The driving transistor includes a gate electrode connected to a first electrode of the storage capacitor, a source electrode connected to a driving voltage line, and a drain electrode electrically connected to an anode of the organic light emitting diode. The driving transistor may receive a data signal, and may supply a driving current to the organic light emitting diode according to a switching operation of the switching transistor.

The switching transistor includes a gate electrode connected to a gate line 121, a source electrode connected to a data line 171, and a drain electrode connected to a source electrode of the driving transistor and a driving voltage line.

The switching transistor may be turned on by the gate signal received through the gate line 121, and may perform a switching operation for transmitting the data signal transmitted through the data line 171 to the source electrode of the driving transistor.

The compensation transistor includes a gate electrode connected to a gate line 121, a source electrode connected to a drain electrode of the driving transistor and an anode of the organic light emitting diode, and a drain electrode connected to a first electrode of the storage capacitor and a gate electrode of the driving transistor. The compensation transistor may be turned on by the gate signal received through the gate line 121, and it may connect the gate electrode and the drain electrode of the driving transistor, thereby diode-connecting the driving transistor.

The storage capacitor may include a first electrode and a second electrode facing each other. The second electrode of the storage capacitor may be connected to the driving voltage line. The cathode of the organic light emitting diode may be connected to the common voltage line.

The organic light emitting diode may include an anode that is a hole injection electrode, a cathode that is an electron injection electrode, and an organic emission layer. Excitons that are combinations of holes injected from the anode and electrons injected from the cathode fall to a ground state from an excited state in the organic emission layer to generate an emission.

Panel pads PP for receiving signals from the outside of the display panel 100 are disposed in the peripheral area PA of the display panel 100. The panel pads PP may be electrically connected to a plurality of signal lines disposed in the display area DA. A gate driver (not shown) may be integrated in the peripheral area PA of the display panel 100, and the gate driver may be disposed as an integrated circuit chip.

The flexible printed circuit board 500 may be bent, and includes a data driver IC 550 and connecting pads CP.

The data driver IC 550 may generate a data voltage that is a gray voltage corresponding to an input image signal. The data driver IC 550 may be mounted on the flexible printed circuit board 500, and may be connected as a tape carrier package (TCP) to the connecting pads CP.

The connecting pads CP are disposed on a side of the flexible printed circuit board 500. The connecting pads CP may be electrically connected to the panel pads PP of the display panel 100 through an anisotropic conductive film 600.

The anisotropic conductive film 600 may include conductive balls (refer to 610 of FIG. 4), and is disposed between the panel pads PP of the display panel 100 and the connecting pads CP of the flexible printed circuit board 500. A panel pad PP of the display panel 100 and a connecting pad CP of the flexible printed circuit board 500 are connected by at least one conductive ball 610, and may be connected by a plurality of conductive balls 610. The display panel 100 and the flexible printed circuit board 500 are connected by the anisotropic conductive film 600, and the display panel 100 may receive signals from the flexible printed circuit board 500.

Figure 3:
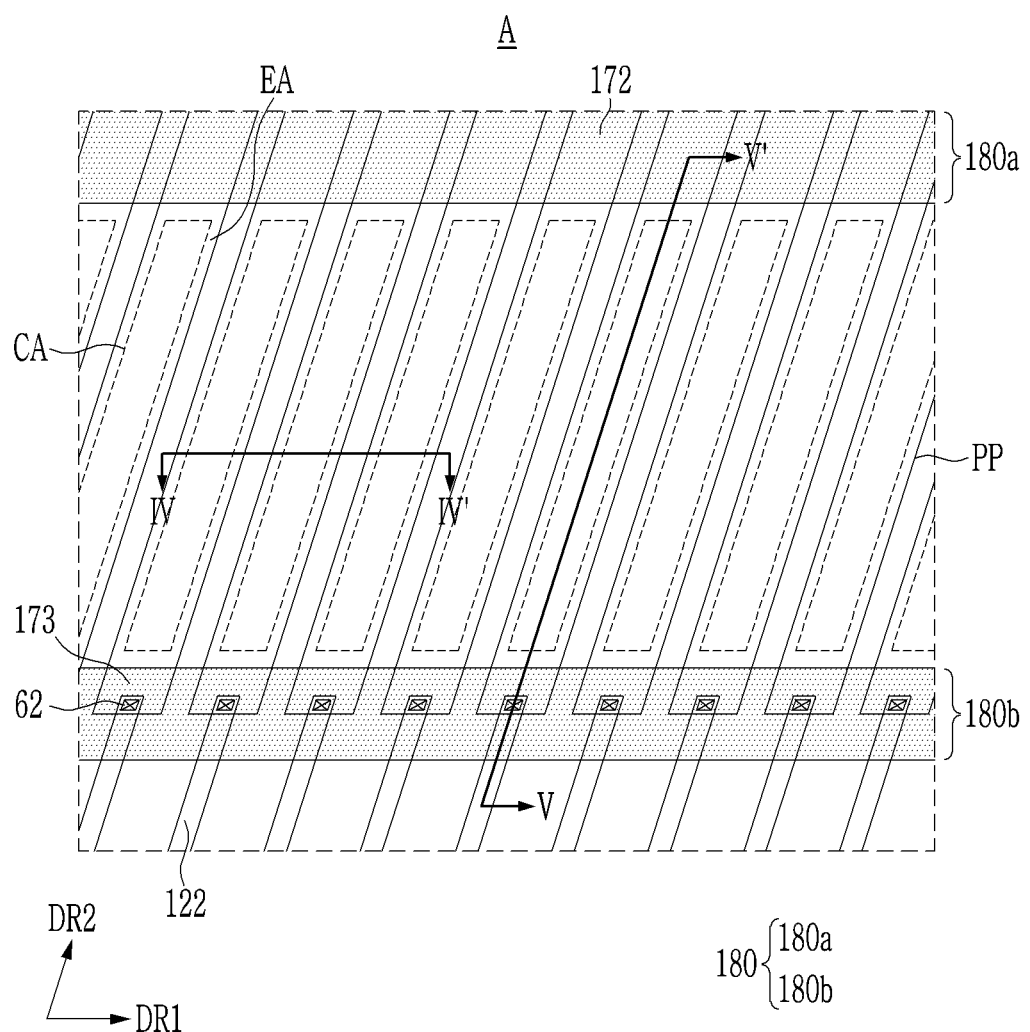
FIG. 3 shows an enlarged top plan view of a region "A" of FIG. 2.
Figure 4:
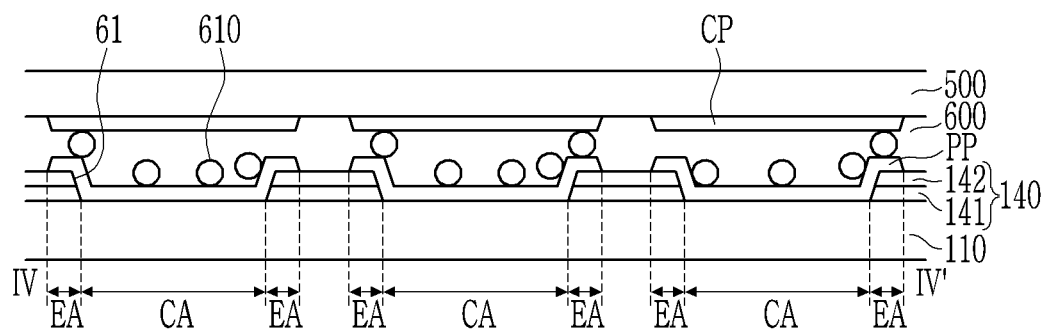
FIG. 4 shows a cross-sectional view with respect to a line IV-IV' of FIG. 3.
Figure 5:
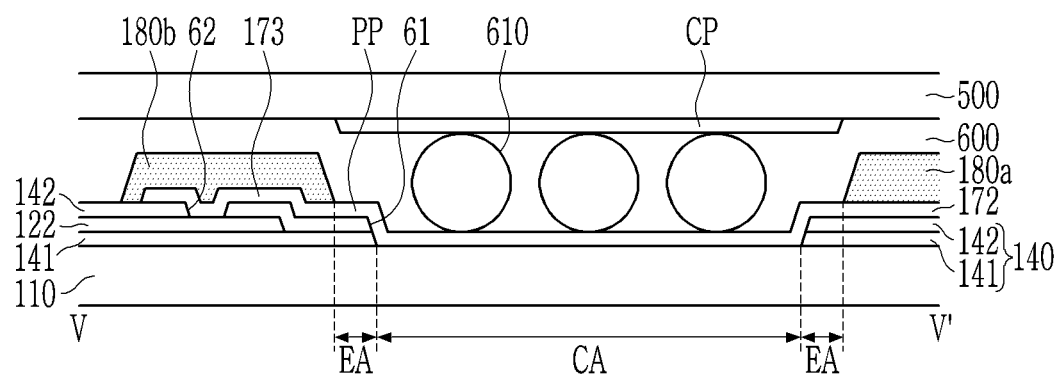
FIG. 5 shows a cross-sectional view with respect to a line V-V' of FIG. 3.

The panel pad PP of the display device 10 according to an example embodiment will now be described in further detail with reference to FIG. 3 to FIG. 5. FIG. 3 shows an enlarged top plan view of a region "A" of FIG. 2; FIG. 4 shows a cross-sectional view with respect to a line IV-IV' of FIG. 3; and FIG. 5 shows a cross-sectional view with respect to a line V-V of FIG. 3. FIG. 4 and FIG. 5 show the anisotropic conductive film (ACF) 600 including the conductive balls 610 connecting the flexible printed circuit board 500 together with the display panel 100.

Referring to FIG. 3 to FIG. 5, in an embodiment, the display panel 100 includes a substrate 110, an insulating layer 140, a test wire 122, a panel pad PP, and an organic layer 180.

The insulating layer 140 is disposed on the substrate 110, and includes a first opening 61 in a portion overlapping a center area CA of the panel pad PP. In an embodiment, the insulating layer 140 includes a first insulating layer 141 and a second insulating layer 142. The first insulating layer 141 is disposed on the substrate 110, and the second insulating layer 142 is disposed on the first insulating layer 141. The second insulating layer 142 includes a second opening 62 for exposing the test wire 122.

Depending on example embodiments, the gate line 121, the gate electrodes of a plurality of transistors, and the storage capacitor may be disposed on the first insulating layer 141 in the display area DA, the second insulating layer 142 may be disposed on the gate line 121, the gate electrodes of a plurality of transistors, and the storage capacitor, and the data line 171 and the source electrodes and the drain electrodes of a plurality of transistors may be disposed on the second insulating layer 142.

The test wire 122 is disposed between the first insulating layer 141 and the second insulating layer 142. The test wire 122 may be connected to a second extension wire 173 through the second opening 62 of the second insulating layer 142, and may transmit a test signal for testing a normal operation to the panel pad PP.

The panel pad PP, a first extension wire 172, and the second extension wire 173 are disposed on the insulating layer 140 and the substrate 110. The panel pads PP are arranged in a first direction DR1. The panel pads PP respectively extend in a second direction DR2. The panel pad PP includes a center area CA and an edge area EA. The center area CA of the panel pad PP overlaps the first opening 61 of the insulating layer 140 and is disposed at a center of the first opening 61, and the edge area EA of the panel pad PP is disposed along a lateral side of the insulating layer 140. The center area CA of the panel pad PP is disposed in the first opening 61 of the insulating layer 140, such that the center area CA of the panel pad PP may be disposed nearer the substrate 110 than the edge area EA of the panel pad PP. In other words, the center area CA of the panel pad PP disposed in a region corresponding to the first opening 61 of the insulating layer 140 may have a concave shape. In an embodiment, the center area CA and the edge area EA of the panel pad PP do not overlap the organic layer 180. The center area CA and the edge area EA of the panel pad PP may contact the anisotropic conductive film (ACF) 600.

Regarding the display device 10 according to an example embodiment, the center area CA of the panel pad PP has a concave shape such that conductive balls 610 of the anisotropic conductive film 600 are gathered in the center area CA of the panel pad PP. Therefore, the conductive balls 610 are prevented or substantially prevented from flowing to the outside of the panel pad PP, and the panel pads PP disposed near the same are prevented or substantially prevented from being electrically connected to each other. FIG. 4 and FIG. 5 illustrate that a plurality of conductive balls 610 is disposed on a panel pad PP. Referring to FIG. 4 and FIG. 5, the conductive balls 610 may have various sizes, and the conductive balls 610 may have a size such that the panel pad PP and the connecting pad CP may be electrically connected to each other by the anisotropic conductive film 600.

It is shown in FIG. 4 that, in an embodiment, the conductive balls 610 are small, and a plurality of conductive balls 610 correspond to one panel pad PP, and further, the conductive balls 610 disposed at the edge area EA of the panel pad PP from among a plurality of conductive balls 610 are shown to contact the connecting pad CP. The conductive balls 610 of FIG. 4 are illustrated, in an embodiment, to have a diameter that corresponds to a step of the panel pad PP, that is, a height difference between the edge area EA and the center area CA.

Referring to FIG. 5, the conductive balls 610 may be larger than that according to an example embodiment of FIG. 4, and FIG. 5 illustrates that the conductive balls 610 are larger than the height difference between the edge area EA and the center area CA. FIG. 5 illustrates that the conductive balls 610 disposed at the center area CA of the panel pad PP contact the connecting pad CP.

The example embodiment described with reference to FIG. 4 or the example embodiment described with reference to FIG. 5 is applicable.

Further, a case of applying the example embodiment of FIG. 4 and the case of applying the example embodiment of FIG. 5 are not intentionally distinguished, and one of the two cases may be applied depending on the size of the conductive balls 610 included in the anisotropic conductive film 600 or a gap between the panel pad PP and the connecting pad CP.

Further, while FIG. 7, FIG. 8, FIG. 10, FIG. 12, and FIG. 14 may show that one or more conductive balls 610 correspond to one panel pad PP in a like manner of FIG. 5, in the case of FIG. 7, FIG. 8, FIG. 10, FIG. 12, and FIG. 14, a plurality of conductive balls 610 may be connected to the connecting pad CP and the panel pad PP through the conductive ball 610 disposed at the edge area EA of the panel pad PP in a like manner of FIG. 4.

The first extension wire 172 is disposed on the insulating layer 140. The first extension wire 172 may extend from one edge of the panel pad PP and may be connected to a signal line (e.g., the data line 171) disposed in the display area DA of the display panel 100.

The second extension wire 173 is disposed on the insulating layer 140. The second extension wire 173 extends from one edge of the panel pad PP and is connected to the test wire 122 in the second opening 62 of the second insulating layer 142.

In an embodiment, the panel pad PP, the first extension wire 172, and the second extension wire 173 may include at least one of titanium (Ti), copper (Cu), aluminum (Al), aluminum-neodymium (AlNd), aluminum-nickel-lanthanum (AlNiLa), an indium tin oxide (ITO), and an indium zinc oxide (IZO). Depending on the example embodiments, the panel pad PP, the first extension wire 172, and the second extension wire 173 may be disposed on a same layer as the data line 171 of the display area DA and/or source/drain electrodes of a plurality of transistors, but are not limited thereto. For example, the first extension wire 172 and the second extension wire 173 may be disposed on a same layer as the gate electrode.

The organic layer 180 is disposed on the first extension wire 172, the second extension wire 173, and the insulating layer 140. The organic layer 180 includes a first organic layer 180a overlapping the first extension wire 172, and a second organic layer 180b overlapping the second extension wire 173. The first organic layer 180a and the second organic layer 180b are disposed near the panel pad PP in the second direction DR2, and extend in the first direction DR1 in a plan view. The first organic layer 180a and the second organic layer 180b may be separated or spaced from each other with the panel pad PP therebetween in the second direction DR2 in a plan view. In an embodiment, the first organic layer 180a and the second organic layer 180b do not overlap the concave center area CA of the panel pad PP, and may overlap a portion extending in the second direction DR2 from the center area CA of the panel pad PP. In an embodiment, the first organic layer 180a and the second organic layer 180b are not disposed among the adjacent panel pads PP, that is, among the center areas CA of the adjacent panel pads PP arranged in the first direction DR1.

Regarding the display device 10 according to an example embodiment, the edge area EA of the panel pad PP may not be covered by the organic layer 180 but may be exposed to the anisotropic conductive film (ACF) 600. In further detail, the edge area EA of the panel pad PP includes a first edge area EA and a second edge area EA facing each other with the center area CA therebetween with respect to the first direction DR1, and the first edge area EA and the second edge area EA may not be covered by the organic layer 180 and may contact the anisotropic conductive film 600. Accordingly, a contact area of the panel pad PP in the first direction DR1 may be increased. In addition, an area of the panel pad PP contacting the anisotropic conductive film 600 may be increased to thereby reduce resistance generated by an electrical connection of the panel pad PP and the connecting pad CP and prevent or substantially prevent the anisotropic conductive film (ACF) 600 from peeling. The center area CA of the panel pad PP has a concave shape, such that the adjacent panel pads PP may not be electrically connected to each other when no organic layer 180 is disposed among the adjacent panel pads PP.

The flexible printed circuit board 500 includes a connecting pad CP. The connecting pad CP may be electrically connected to the data driver IC 550 described with reference to FIG. 1 and FIG. 2. The connecting pad CP may overlap the panel pad PP with the anisotropic conductive film (ACF) 600 therebetween. The connecting pad CP may be electrically connected to the panel pad PP through the conductive balls 610 of the anisotropic conductive film 600.

Figure 6:
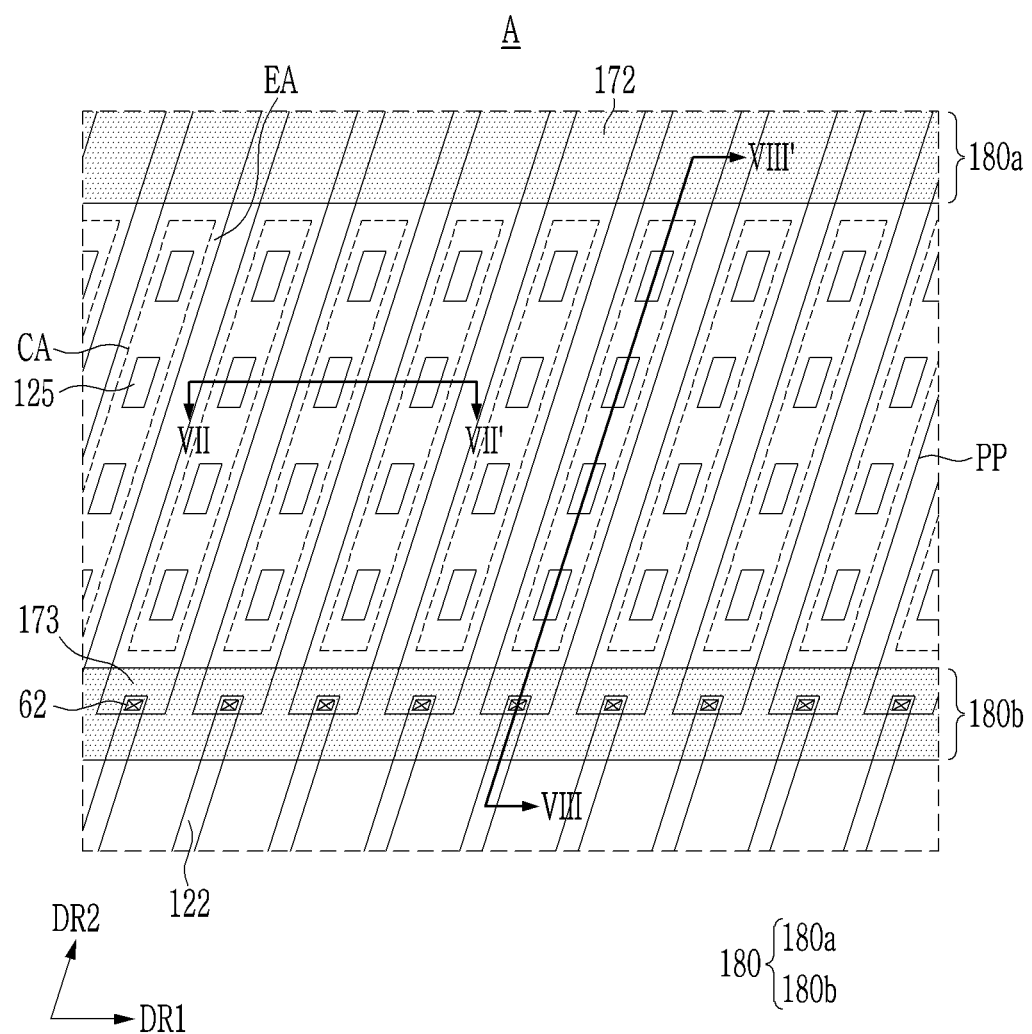
FIG. 6 shows an enlarged top plan view of a region "A" of FIG. 2 in a display device according to an example embodiment.
Figure 7:
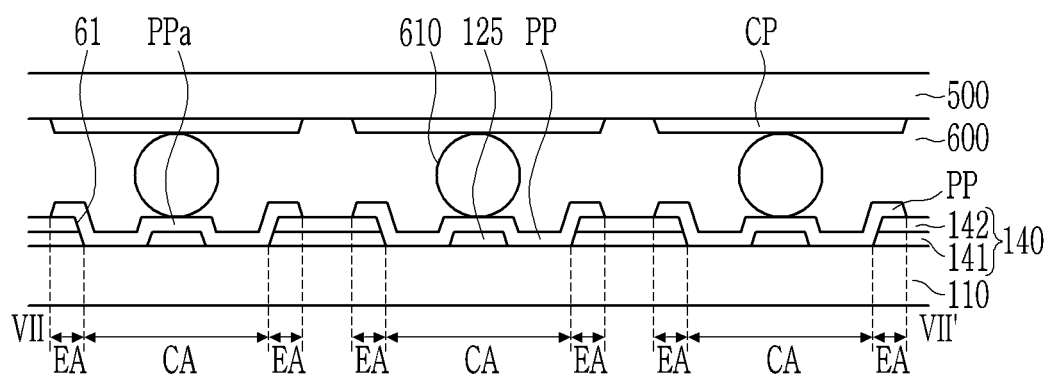
FIG. 7 shows a cross-sectional view with respect to a line VII-VII' of FIG. 6.
Figure 8:
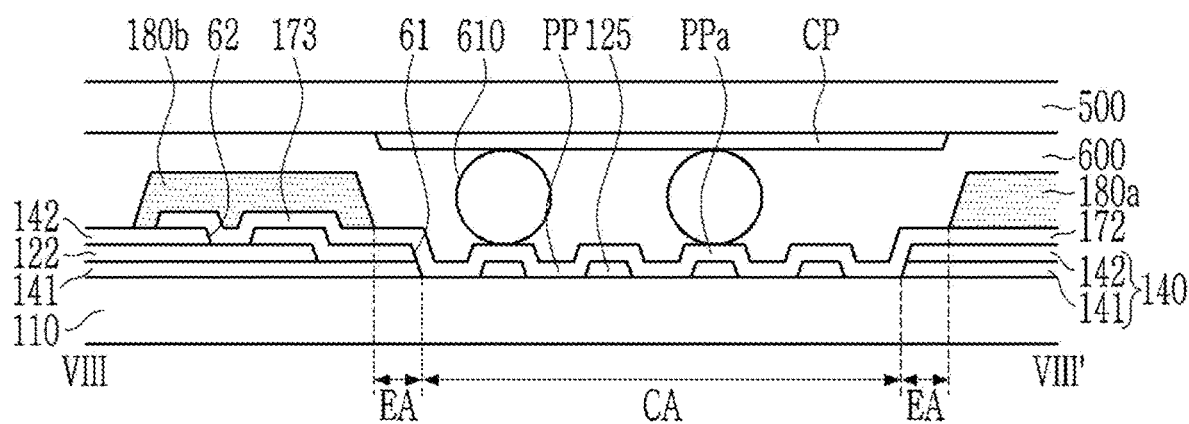
FIG. 8 shows a cross-sectional view with respect to a line VIII-VIII' of FIG. 6.

A display device according to an example embodiment will now be described with reference to FIG. 6 to FIG. 8. FIG. 6 shows an enlarged top plan view of a region "A" of FIG. 2 in a display device according to an example embodiment; FIG. 7 shows a cross-sectional view with respect to a line VII-VII' of FIG. 6; and FIG. 8 shows a cross-sectional view with respect to a line VIII-VIII' of FIG. 6. FIG. 7 and FIG. 8 further illustrate the flexible printed circuit board 500 and the anisotropic conductive film (ACF) 600 together with the display panel 100.

Referring to FIG. 6 to FIG. 8, the display panel 100 of the display device 10 according to an example embodiment includes a substrate 110, a lower pattern 125, an insulating layer 140, a test wire 122, a panel pad PP, and an organic layer 180. The lower pattern 125 is disposed between the substrate 110 and the panel pad PP, and is disposed in a region in which the first opening 61 of the insulating layer 140 is disposed. In other words, the lower pattern 125 overlaps the center area CA of the panel pad PP. The lower pattern 125 may float and may not receive a voltage. One panel pad PP may overlap a plurality of lower patterns 125, and the lower patterns 125 may be arranged in the second direction DR2 that is the direction in which the panel pad PP extends and may be separated or spaced from each other. That is, the lower pattern 125 may include a first lower pattern 125 and a second lower pattern 125 that are disposed near each other in the second direction DR2.

In an embodiment, a width of the lower pattern 125 in the first direction DR1 in a plan view may be equal to or greater than 2 μm. Further, in an embodiment, the width of the lower pattern 125 in the second direction DR2 in a plan view may be equal to or greater than 2 μm. In an embodiment, the lower pattern 125 may include at least one of molybdenum (Mo), titanium (Ti), copper (Cu), an indium tin oxide (ITO), and an indium zinc oxide (IZO). Depending on example embodiments, the lower pattern 125 may be disposed on the same layer as the gate line 121 of the display area DA and gate electrodes of a plurality of transistors, but is not limited thereto. For example, the lower pattern 125 may be disposed on the same layer as the source/drain electrodes.

The center area CA of the panel pad PP is disposed on the substrate 110 and the lower pattern 125. The center area CA of the panel pad PP includes a protruding portion PPa disposed on the lower pattern 125 and protruding more than other portions. In other words, the protruding portion PPa of the panel pad PP overlaps the lower pattern 125. In an embodiment, the panel pad PP may include at least one of titanium (Ti), copper (Cu), aluminum (Al), aluminum-neodymium (AlNd), aluminum-nickel-lanthanum (AlNiLa), an indium tin oxide (ITO), and an indium zinc oxide (IZO). Depending on example embodiments, the panel pad PP, the first extension wire 172, and the second extension wire 173 may be disposed on the same layer as the data line 171 of the display area DA and the source/drain electrodes of a plurality of transistors, but are not limited thereto.

The display panel 100 of the display device 10 according to an example embodiment includes the lower pattern 125 disposed below the panel pad PP, and the panel pad PP may include the protruding portion PPa. Therefore, the area of the panel pad PP contacting the anisotropic conductive film (ACF) 600 may be further increased. Further, it is shown in FIG. 7 and FIG. 8 that, in an embodiment, the panel pad PP and the connecting pad CP are electrically connected to each other through the conductive balls 610 disposed on the protruding portion PPa in the center area CA of the panel pad PP. However, in a like manner described with reference to FIG. 4, in an embodiment, the panel pad PP and the connecting pad CP may be electrically connected to each other through conductive balls 610 disposed at the edge area EA of the panel pad PP.

Figure 9:
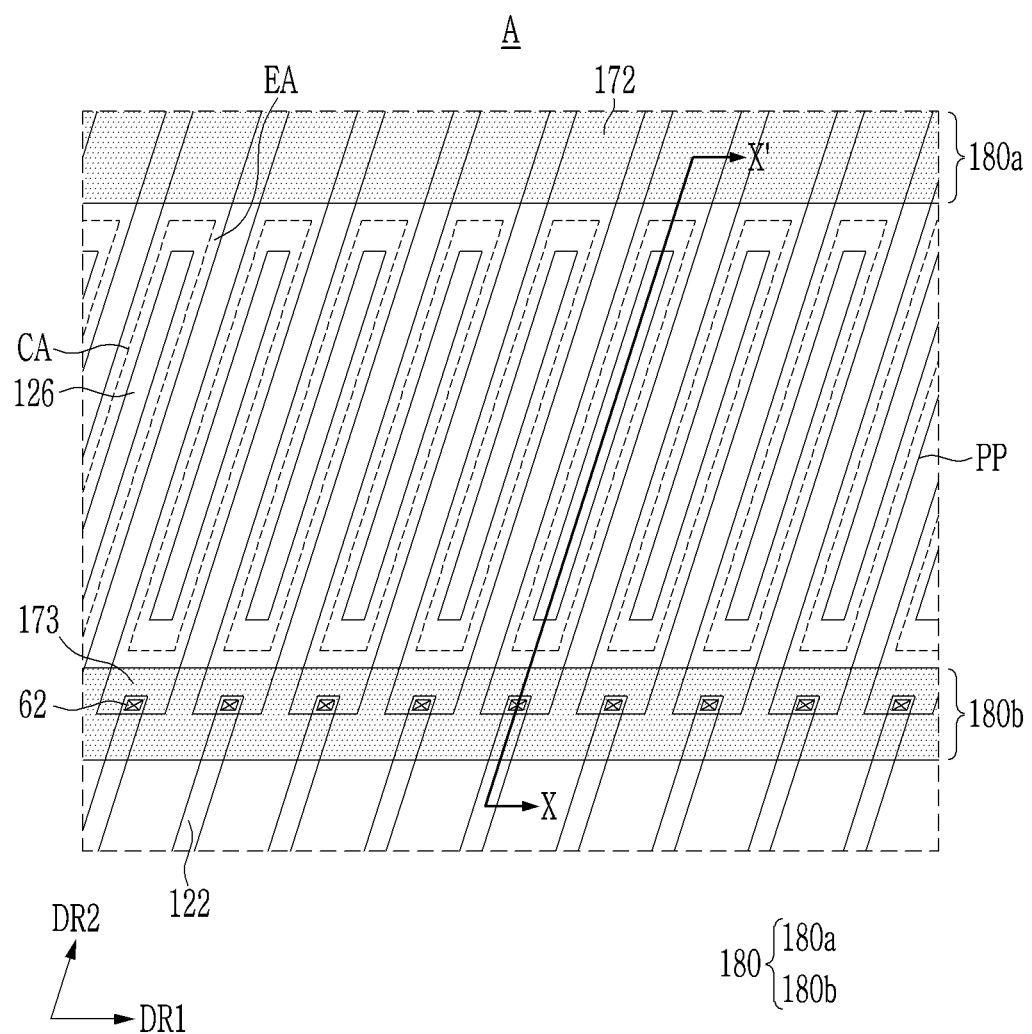
FIG. 9 shows an enlarged top plan view of a region "A" of FIG. 2 in a display device according to an example embodiment.
Figure 10:
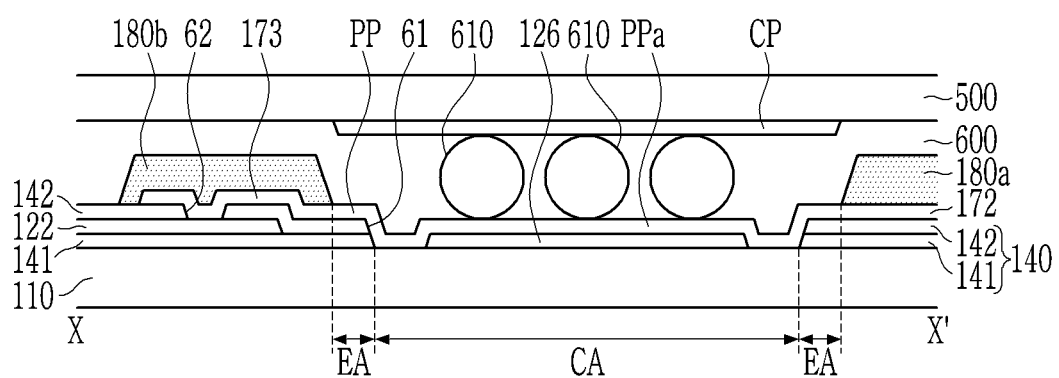
FIG. 10 shows a cross-sectional view with respect to a line X-X' of FIG. 9.

A display device according to an example embodiment will now be described with reference to FIG. 9 and FIG. 10. FIG. 9 shows an enlarged top plan view of a region "A" of FIG. 2 in a display device according to an example embodiment; and FIG. 10 shows a cross-sectional view with respect to a line X-X' of FIG. 9. FIG. 10 also illustrates a flexible printed circuit board 500 and an anisotropic conductive film (ACF) 600 together with the display panel 100.

Referring to FIG. 9 and FIG. 10, the display panel 100 of the display device 10 according to an example embodiment includes a substrate 110, a lower pattern 126, an insulating layer 140, a test wire 122, a panel pad PP, and an organic layer 180.

The lower pattern 126 is disposed between the substrate 110 and the panel pad PP, and is disposed in the region in which the first opening 61 of the insulating layer 140 is disposed. In other words, the lower pattern 126 overlaps the center area CA of the panel pad PP. The lower pattern 126 may float and may not receive a voltage. The lower pattern 126 may extend in a direction in which the panel pad PP extends. In an embodiment, one panel pad PP may overlap one lower pattern 126. In an embodiment, a width of the lower pattern 126 in the first direction DR1 in a plan view may be equal to or greater than 2 μm. Further, in an embodiment, a width of the lower pattern 126 in the second direction DR2 in a plan view may be equal to or greater than 2 μm. Depending on example embodiments, the lower pattern 126 may be disposed on the same layer as the gate line 121 of the display area DA and gate electrodes of a plurality of transistors.

The center area CA of the panel pad PP is disposed on the substrate 110 and the lower pattern 126. In an embodiment, the center area CA of the panel pad PP includes a protruding portion PPa disposed on the lower pattern 126 and protruding more than other portions. In other words, the protruding portion PPa of the panel pad PP overlaps the lower pattern 126. Depending on example embodiments, the panel pad PP, the first extension wire 172, and the second extension wire 173 may be disposed on the same layer as the data line 171 of the display area DA and source/drain electrodes of a plurality of transistors, but are not limited thereto. Further, FIG. 10 illustrates that, in an embodiment, the panel pad PP and the connecting pad CP are electrically connected to each other through the conductive ball 610 disposed at the center area CA of the panel pad PP and on an upper side of the lower pattern 126. However, in an embodiment, the panel pad PP and the connecting pad CP may be electrically connected to each other through the conductive balls 610 disposed at the edge area EA of the panel pad PP in a like manner of FIG. 4.

Figure 11:
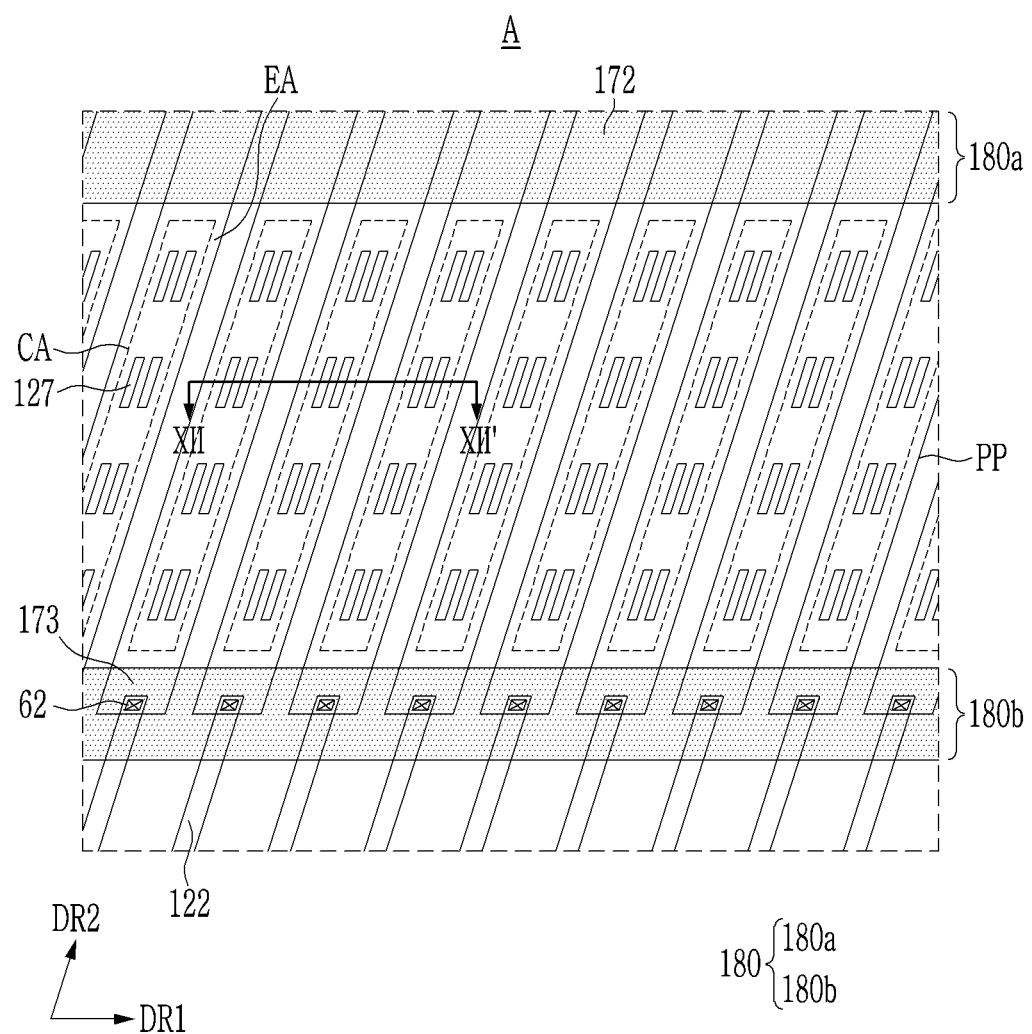
FIG. 11 shows an enlarged top plan view of a region "A" of FIG. 2 in a display device according to an example embodiment.
Figure 12:
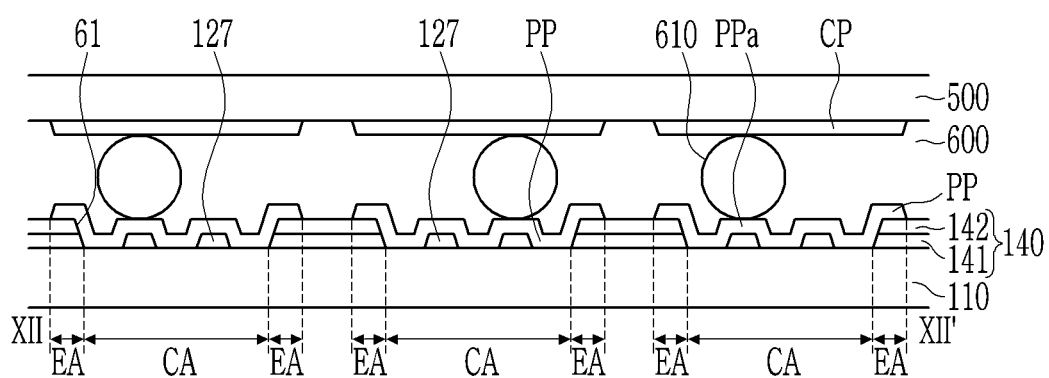
FIG. 12 shows a cross-sectional view with respect to a line XII-XII' of FIG. 11.

A display device according to an example embodiment will now be described with reference to FIG. 11 and FIG. 12. FIG. 11 shows an enlarged top plan view of a region "A" of FIG. 2 in a display device according to an example embodiment; and FIG. 12 shows a cross-sectional view with respect to a line XI I-XI I' of FIG. 11. FIG. 12 illustrates a flexible printed circuit board 500 and an anisotropic conductive film (ACF) 600 together with the display panel 100.

Referring to FIG. 11 and FIG. 12, the display panel 100 of the display device 10 according to an example embodiment includes a substrate 110, a lower pattern 127, an insulating layer 140, a test wire 122, a panel pad PP, and an organic layer 180.

The lower pattern 127 is disposed between the substrate 110 and the panel pad PP, and is disposed in the region in which the first opening 61 of the insulating layer 140 is disposed. In other words, the lower pattern 127 overlaps the center area CA of the panel pad PP. The lower pattern 127 may float and may not receive a voltage. In an embodiment, one panel pad PP may overlap a plurality of lower patterns 127, and the lower patterns 127 may be arranged in the second direction DR2 and may be separated or spaced from each other. Further, the lower patterns 127 may be arranged in the first direction DR1. That is, the lower pattern 127 may include a first lower pattern 127 and a second lower pattern 127 provided near each other in the first direction DR1. In an embodiment, a width of the lower pattern 127 in the first direction DR1 in a plan view may be equal to or greater than 2 μm. Further, in an embodiment, a width of the lower pattern 127 in the second direction DR2 in a plan view may be equal to or greater than 2 μm. Depending on example embodiments, the lower pattern 127 may be disposed on the same layer as the gate line 121 of the display area DA and gate electrodes of a plurality of transistors.

The center area CA of the panel pad PP is disposed on the substrate 110 and the lower pattern 127. In an embodiment, the center area CA of the panel pad PP includes a protruding portion PPa disposed on the lower pattern 127 and protruding more than other portions. In other words, the protruding portion PPa of the panel pad PP overlaps the lower pattern 127. Depending on example embodiments, the panel pad PP, the first extension wire 172, and the second extension wire 173 may be disposed on the same layer as the data line 171 of the display area DA and source/drain electrodes of a plurality of transistors, but are not limited thereto. Further, FIG. 12 illustrates that, in an embodiment, the panel pad PP and the connecting pad CP are electrically connected to each other through the conductive balls 610 disposed at the center area CA of the panel pad PP and on the upper portion of the lower pattern 127. However, in an embodiment, the panel pad PP and the connecting pad CP may be electrically connected to each other through the conductive balls 610 disposed at the edge area EA of the panel pad PP in a like manner of FIG. 4.

Figure 13:
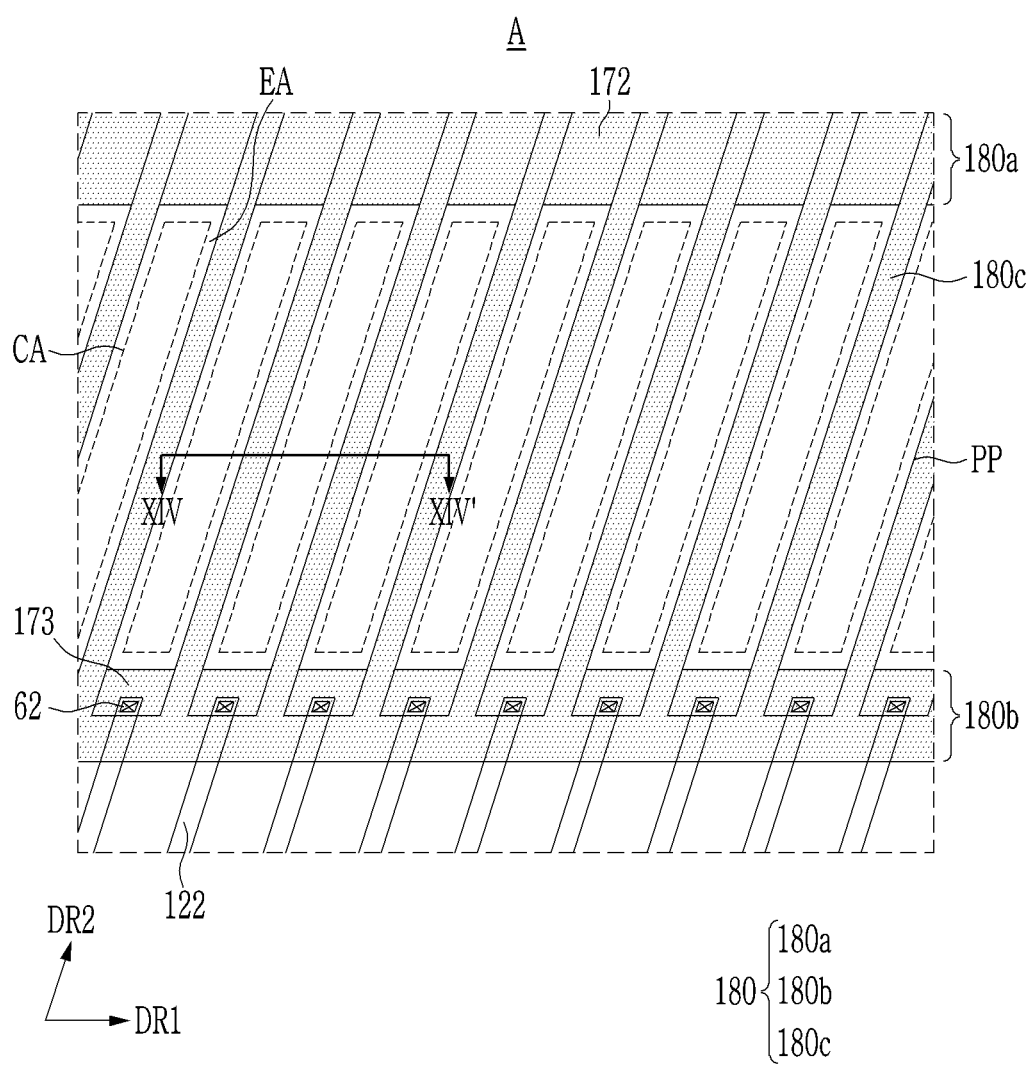
FIG. 13 shows an enlarged top plan view of a region "A" of FIG. 2 in a display device according to an example embodiment.
Figure 14:
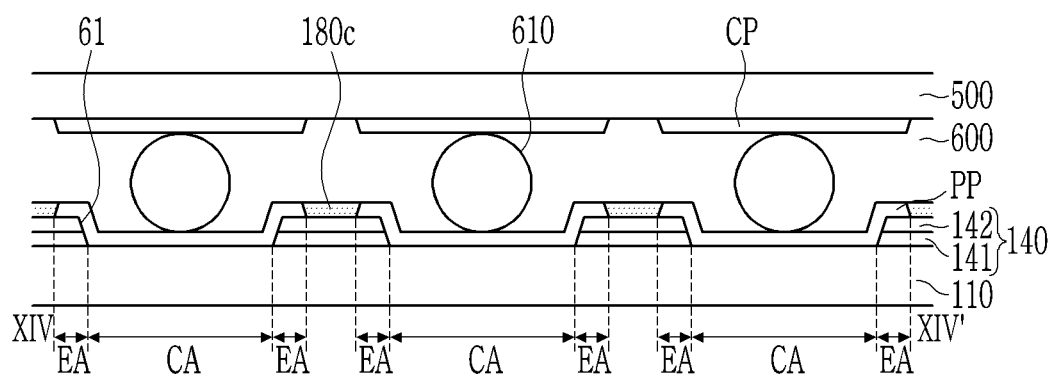
FIG. 14 shows a cross-sectional view with respect to a line XIV-XIV' of FIG. 13.

A display device according to an example embodiment will now be described with reference to FIG. 13 and FIG. 14. FIG. 13 shows an enlarged top plan view of a region "A" of FIG. 2 in a display device according to an example embodiment; and FIG. 14 shows a cross-sectional view with respect to a line XIV-XIV' of FIG. 13. FIG. 14 illustrates a flexible printed circuit board 500 and an anisotropic conductive film (ACF) 600 together with the display panel 100.

Referring to FIG. 13 and FIG. 14, the display panel 100 of the display device 10 according to an example embodiment includes a substrate 110, an insulating layer 140, a test wire 122, a panel pad PP, and an organic layer 180.

Regarding the display panel 100 of the display device 10 according to an example embodiment, the organic layer 180 is disposed around (e.g., to surround) the respective panel pads PP. The organic layer 180 includes a first organic layer 180a overlapping the first extension wire 172, a second organic layer 180b overlapping the second extension wire 173, and a third organic layer 180c disposed among adjacent panel pads PP.

In an embodiment, the third organic layer 180c disposed among the panel pads PP that are disposed near each other in the first direction DR1 contacts a lateral side of the panel pad PP and does not contact a top side of the panel pad PP. Therefore, the adjacent panel pads PP may be insulated, and the area of the panel pad PP contacting the anisotropic conductive film (ACF) 600 may be increased. Further, FIG. 14 illustrates that, in an embodiment, the panel pad PP and the connecting pad CP are electrically connected to each other through the conductive balls 610 disposed at the center area CA of the panel pad PP. However, in an embodiment, the panel pad PP and the connecting pad CP may be electrically connected to each other through the conductive balls 610 disposed at the edge area EA of the panel pad PP in a like manner of FIG. 4.

While this disclosure has been described in connection with what are presently considered to be some practical example embodiments, it is to be understood that the invention is not limited to the disclosed embodiments, but, on the contrary, is intended to cover various modifications and equivalent arrangements included within the spirit and scope of the appended claims.

What is claimed is:
1. A display device comprising:
a substrate;
an insulating layer on the substrate and comprising a first opening;
a first panel pad on the substrate and the insulating layer; and an anisotropic conductive film on the first panel pad,
wherein the first panel pad comprises
a center area located at a center of the first opening, and
a first edge area and a second edge area arranged along a lateral side of the insulating layer and located on respective sides of the center area with respect to a first direction, and
the anisotropic conductive film overlaps at least one of the center area, the first edge area, and the second edge area of the first panel pad.

2. The display device of claim 1, further comprising:
a second panel pad located near the first panel pad in the first direction; and
an organic layer on the insulating layer,
wherein the organic layer comprises a first organic layer and a second organic layer that are spaced from each other with the first panel pad and the second panel pad therebetween.

3. The display device of claim 2, further comprising a first lower pattern between the substrate and the center area of the first panel pad.

4. The display device of claim 3, further comprising a second lower pattern between the substrate and the center area of the first panel pad, and spaced from the first lower pattern in a second direction traversing the first direction.

5. The display device of claim 4, wherein
the center area of the first panel pad comprises a plurality of protruding portions, and
the protruding portions overlap the first lower pattern and the second lower pattern.

6. The display device of claim 3, wherein the first lower pattern extends along the center area of the first panel pad.

7. The display device of claim 6, wherein
the center area of the first panel pad comprises a protruding portion, and
the protruding portion overlaps the first lower pattern.

8. The display device of claim 3, further comprising a second lower pattern between the substrate and the center area of the first panel pad, and spaced from the first lower pattern in the first direction.

9. The display device of claim 8, wherein
the center area of the first panel pad comprises a plurality of protruding portions, and
the protruding portions overlap the first lower pattern and the second lower pattern.

10. The display device of claim 1, further comprising:
a second panel pad located near the first panel pad in the first direction; and
an organic layer on the insulating layer,
wherein the organic layer is between the first panel pad and the second panel pad, and
the organic layer is not located on the first edge area and the second edge area of the first panel pad.

11. The display device of claim 2, further comprising
a data line to apply a data voltage; and
a first extension wire extending from the first panel pad and electrically connected to the data line,
wherein the first extension wire overlaps the first organic layer.

12. The display device of claim 11, further comprising:
a second extension wire extending from the first panel pad; and
a test wire,
wherein the insulating layer comprises a second opening exposing the test wire,
the second extension wire is connected to the test wire in the second opening, and
the second extension wire overlaps the second organic layer.

13. The display device of claim 1, further comprising
a flexible printed circuit board comprising a connecting pad,
wherein the connecting pad is electrically connected to the first panel pad through the anisotropic conductive film.

14. A display device comprising:
a display panel comprising a first panel pad and an organic layer exposing the first panel pad;
a flexible printed circuit board comprising a connecting pad; and
an anisotropic conductive film between the display panel and the flexible printed circuit board,
wherein the first panel pad comprises a concave center area and an edge area around the center area, and
the organic layer comprises a first organic layer and a second organic layer spaced from each other with the first panel pad therebetween.

15. The display device of claim 14, wherein
the display panel further comprises a substrate and an insulating layer between the substrate and the first panel pad, and
the insulating layer comprises a first opening in a region corresponding to the center area of the first panel pad.

16. The display device of claim 15, wherein the display panel further comprises a first lower pattern between the substrate and the center area of the first panel pad.

17. The display device of claim 16, wherein
the display panel further comprises:
a second panel pad located near the first panel pad in a first direction; and
a second lower pattern between the substrate and the center area of the first panel pad, and spaced from the first lower pattern in a second direction traversing the first direction.

18. The display device of claim 17, wherein a width of the first lower pattern is equal to or greater than 2 μm.

19. The display device of claim 16, wherein the first lower pattern extends along the center area of the first panel pad.

20. The display device of claim 16, wherein
the display panel further comprises:
a second panel pad located near the first panel pad in a first direction; and
a second lower pattern between the substrate and the center area of the first panel pad, and spaced from the first lower pattern in the first direction.

* * * * *